(12) United States Patent
Prasher et al.

(10) Patent No.: US 6,661,660 B2
(45) Date of Patent: Dec. 9, 2003

(54) INTEGRATED VAPOR CHAMBER HEAT SINK AND SPREADER AND AN EMBEDDED DIRECT HEAT PIPE ATTACHMENT

(75) Inventors: Ravi Prasher, Phoenix, AZ (US); Abhay A. Watwe, Chandler, AZ (US); Gregory M. Chrysler, Chandler, AZ (US); Kristopher Frutschy, Phoenix, AZ (US); Leo Ofman, Scottsdale, AZ (US); Ajit V. Sathe, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/970,954

(22) Filed: Oct. 4, 2001

(65) Prior Publication Data

US 2002/0080584 A1 Jun. 27, 2002

Related U.S. Application Data

(62) Division of application No. 09/746,554, filed on Dec. 22, 2000.

(51) Int. Cl.⁷ .................................................. H05K 7/20
(52) U.S. Cl. .................. 361/700; 361/702; 361/703; 361/704; 361/717; 361/718; 361/719; 257/714; 257/718; 174/15.2; 174/16.3; 165/80.3; 165/80.4; 165/104.26
(58) Field of Search ................... 361/687, 699, 361/700, 710–712, 704, 705; 257/707, 714, 715, 718, 719, 727; 165/80.3, 80.4, 104.33; 174/15.2, 16.3

(56) References Cited

U.S. PATENT DOCUMENTS

| | | | |
|---|---|---|---|
| 4,069,672 A | 1/1978 | Milling ........................ 60/618 |
| 5,176,000 A | 1/1993 | Dauksis ........................ 60/618 |
| 5,282,111 A | 1/1994 | Hopfer ........................ 361/704 |
| 5,331,510 A | 7/1994 | Ouchi et al. ................. 361/702 |
| 5,549,155 A * | 8/1996 | Meyer, IV et al. ..... 165/104.33 |
| 5,582,242 A | 12/1996 | Hamburgen et al. ... 165/104.21 |
| 5,699,227 A | 12/1997 | Kolman et al. ............. 361/700 |
| 5,804,875 A * | 9/1998 | Remsburg et al. .......... 257/718 |
| 5,880,524 A | 3/1999 | Xie ............................. 257/704 |
| 5,949,647 A | 9/1999 | Kolman et al. ............. 361/700 |
| 5,955,797 A | 9/1999 | Kim ........................... 307/150 |
| 5,982,297 A | 11/1999 | Welle .................... 340/870.16 |
| 6,082,443 A | 7/2000 | Yamamoto et al. .... 165/104.26 |
| 6,111,750 A * | 8/2000 | Gates ........................ 361/700 |
| 6,125,035 A * | 9/2000 | Hood, III et al. ........... 361/687 |
| 6,133,631 A | 10/2000 | Belady ....................... 257/714 |
| 6,163,073 A * | 12/2000 | Patel .......................... 257/712 |
| 6,178,088 B1 * | 1/2001 | Gates ........................ 361/699 |
| 6,197,257 B1 | 3/2001 | Raskas .................... 422/82.05 |
| 6,212,074 B1 | 4/2001 | Gonsalves et al. .......... 361/717 |
| 6,226,178 B1 * | 5/2001 | Broder et al. ............... 361/687 |
| 6,227,287 B1 | 5/2001 | Tanaka et al. ............. 165/80.4 |
| 6,263,959 B1 | 7/2001 | Ikeda et al. ............ 165/104.26 |
| 6,313,987 B1 * | 11/2001 | O'Connor et al. .......... 361/687 |
| 6,317,322 B1 | 11/2001 | Ueki et al. ................. 361/700 |
| 6,321,452 B1 * | 11/2001 | Lin ....................... 29/890.032 |
| 6,324,592 B1 | 11/2001 | Hindman ....................... 710/3 |
| 6,328,097 B1 * | 12/2001 | Bookhardt et al. .... 165/104.33 |
| 6,349,035 B1 * | 2/2002 | Koenen ..................... 361/719 |

\* cited by examiner

*Primary Examiner*—Boris Chervinsky
(74) *Attorney, Agent, or Firm*—Schwegman, Lundberg, Woessner & Kluth, P.A.

(57) ABSTRACT

Two types of thermal management devices for efficiently dissipating heat generated by high performance electronic devices, such as microprocessors for desktop and server computers producing a power of near 200 Watts and high power electronic devices that are small and thin, such as those used in telephones, radios, laptop computers, and handheld devices. An integrated heat sink and spreader for cooling an item has a vapor chamber heat sink with a thinner first wall and a thicker second wall. The thicker second wall is engageable with the item in efficient heat transferring relationship. A plurality of heat-radiating fins are attached to the thinner first wall. An embedded direct heat pipe attachment includes a heat pipe embedded in a spreader plate that is in direct heat transferring contact with an item through a thin, uniform layer of thermal interface material.

17 Claims, 16 Drawing Sheets

INTEGRATED VAPOR CHAMBER HEAT SINK AND SPREADER AND AN EMBEDDED DIRECT HEAT PIPE ATTACHMENT

CROSS REFERENCE

This application is a divisional of application U.S. Ser. No. 09/746,554, filed on Dec. 22, 2000, entitled "An Integrated Vapor Chamber Heat Sink and Spreader and an Embedded Direct Heat Pipe Attachment," currently pending.

TECHNICAL FIELD OF THE INVENTION

The present invention relates generally to the field of electronic devices and, in particular, the present invention relates to thermal management of electronic devices.

BACKGROUND

The current trends in microprocessor design are to increase their power, decrease their size, and increase their speed. This results in higher power in a smaller, faster microprocessor. Another trend is towards lightweight and compact electronic devices. As microprocessors become lighter, smaller, and more powerful, they also generate more heat in a smaller space, making thermal management a greater concern than before.

The purpose of thermal management is to maintain the temperature of a device within a moderate range. During operation, electronic devices dissipate power as heat. The heat must be removed from the device; otherwise, it will get hotter and hotter until it fails, reducing its service life. Short of failure, electronic devices run slowly and dissipate power poorly at high temperatures.

Naturally, heat moves from the device to the surrounding air and warms up the air by convection. The temperature at the surface of a heat-generating device is called the junction temperature. Heat is generated at the junction and must move from the junction to the surrounding or ambient air. Unfortunately, there is always some resistance to heat transfer, called thermal resistance. Basically, it is not easy to move heat from the device into the surrounding air. In fact, air is a rather good thermal insulator. Lowering the thermal resistance from the junction to the ambient air increases the power dissipation. To lower this thermal resistance, heat sinks are used.

An Integrated Vapor Chamber Heat Sink and Spreader

Current thermal designs do not have a sufficiently low thermal resistance to efficiently dissipate the heat generated by the new high power electronic devices. One such design for desktop and server computers is shown in FIG. 15. Two layers of thermal interface material 1508, 1510 between the die 1504 and the heat sink 1516 contribute a significant portion of the total thermal resistance. Also, the long distance between the die 1504 and the heat sink 1516 contributes to the high thermal resistance. There is a need for a new thermal design with a lower thermal resistance that can efficiently dissipate heat for high power electronic devices.

If the heat sink 1516 were put directly in contact with the die 1504, the thin lower wall of the heat sink 1516 would not have enough area available for heat transfer. Consequently, it would increase the thermal resistance internal to the heat sink 1516 and inefficiently dissipate heat. There is a need for a new thermal design that puts a heat sink directly in contact with the die and overcomes the problem of high internal thermal resistance.

Heat spreading is another problem introduced by putting a heat sink directly in contact with a die. Often there are "hot spots" on the die. Hot spots are spatial variations of power dissipation that increase the local temperature and cause malfunctions. Current thermal designs, such as the one shown in FIG. 15 have a heat spreader 1506 with inefficient heat spreading. There is a need for a new thermal design for desktop and server computers that eliminates the separate heat spreader, puts a heat sink directly in contact with the die, and spreads heat more uniformly.

An Embedded Direct Heat Pipe Attachment

Current designs for new high power mobile electronic devices, such as telephones, radios, laptop computers, and handheld devices do not efficiently dissipate the heat generated by these devices. One such design is shown in FIG. 16. The total thermal resistance is too high for effective power dissipation. One reason is that the heat pipe 1612 is too far away from the die 1604. Another reason is that the spreader plate 1608 lies between the heat pipe 1612 and the die 1604. There is a need for a new thermal design with low thermal resistance for effective power dissipation in mobile devices that embeds a heat pipe in a heat spreader and puts it in direct contact with the die.

In the prior art, applying forces 1614 at the corners of the spreader plate 1608 produces unbalanced loads that sometimes cause the spreader plate 1608 to tilt in various ways as it presses down on the thermal interface material 1606. This leads to large variations in the bond line thickness of the thermal interface material. These bond line thickness variations increase thermal resistance to an unacceptable level and reduce product reliability. There is a need for a new thermal design with central point loading over the center of the die resulting in uniform thickness of the thermal interface material and decreasing thermal resistance.

If a heat pipe is put in direct contact with the die, it must be protected from caving in under the pressure of the point load. There is a need for a new thermal design that embeds a heat pipe in a heat spreader so that the heat pipe is protected.

BRIEF DESCRIPTION OF THE DRAWINGS

An Integrated Vapor Chamber Heat Sink and Spreader

An Embedded Direct Heat Pipe Attachment

Figure 6:
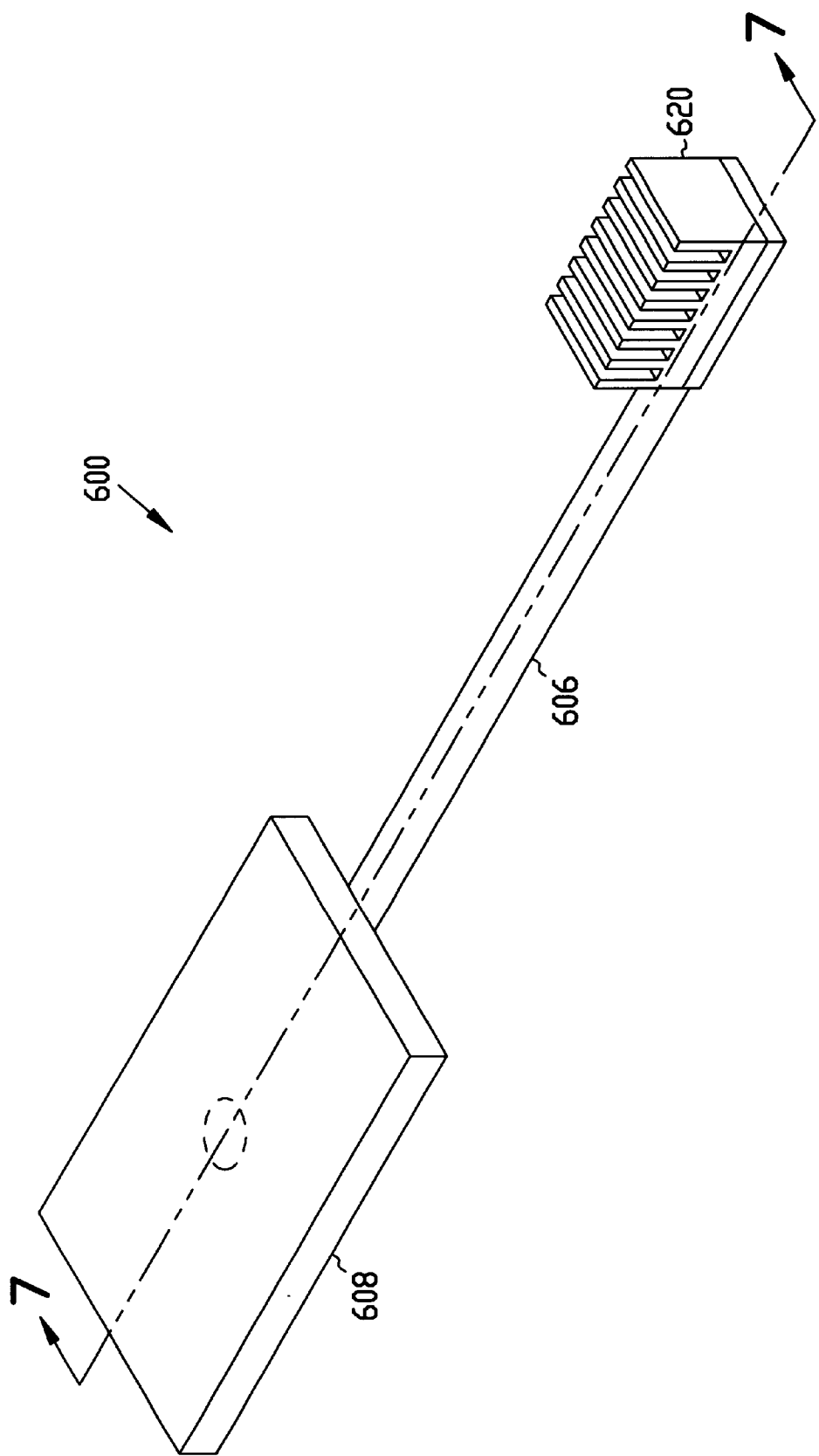

FIG. 6 shows a perspective view of one embodiment of an arrangement for pressing a heat-generating item against a substrate.

Figure 1:
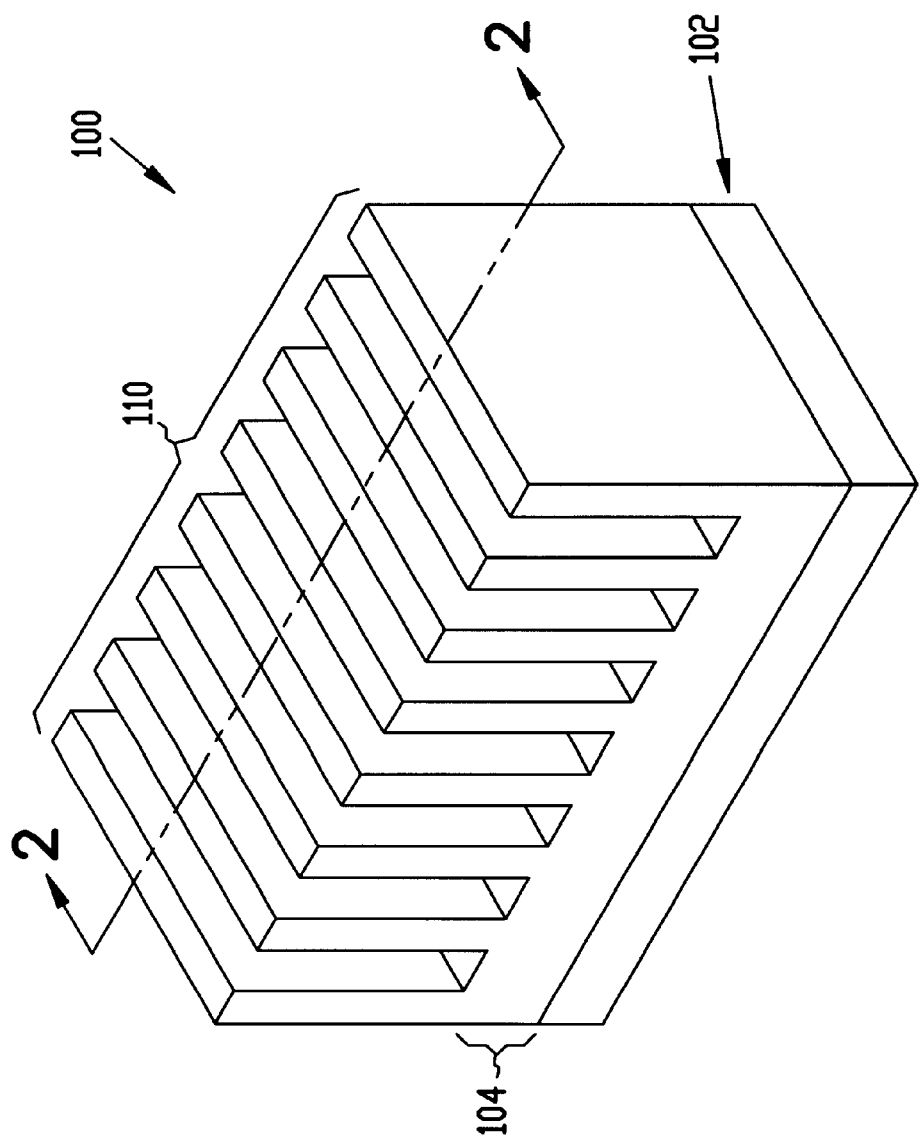
FIG. 1 shows a perspective view of one embodiment of an integrated heat sink and spreader.
Figure 7:
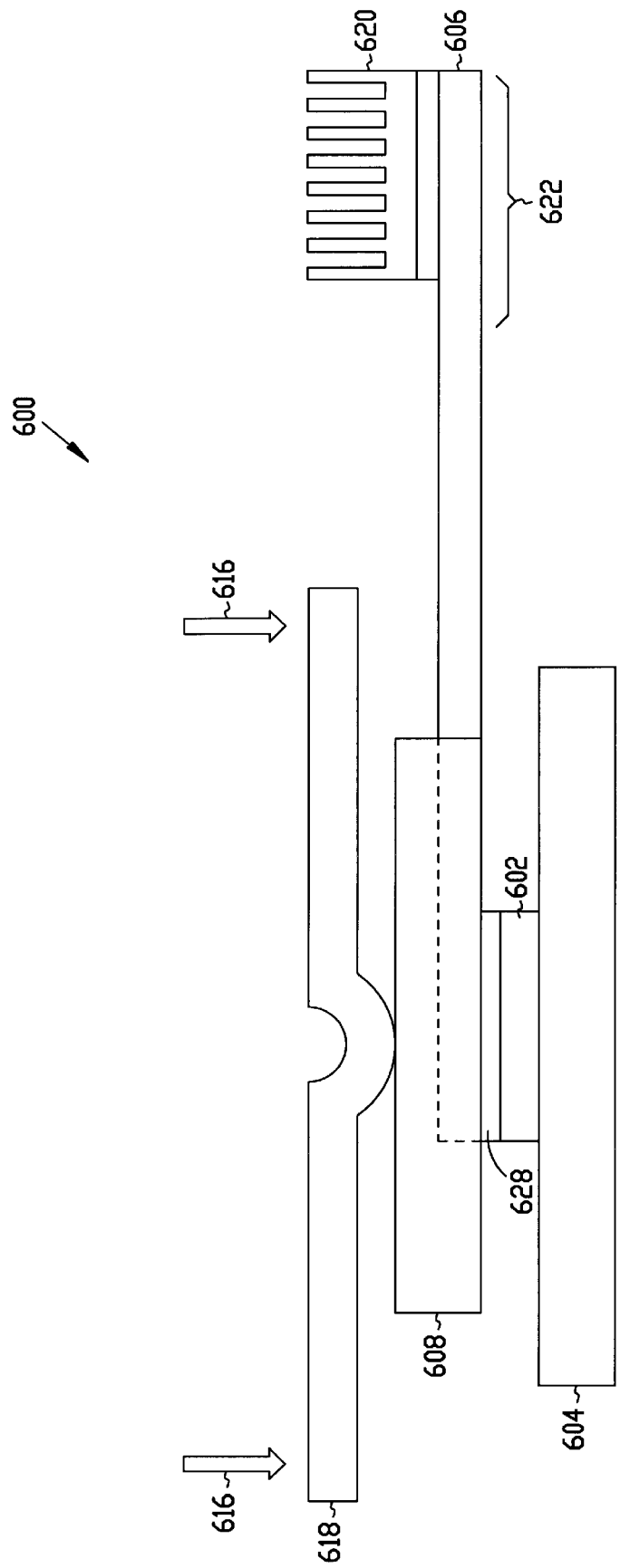

FIG. 7 shows a cross-section view of the arrangement in FIG. 1.

Figure 8:
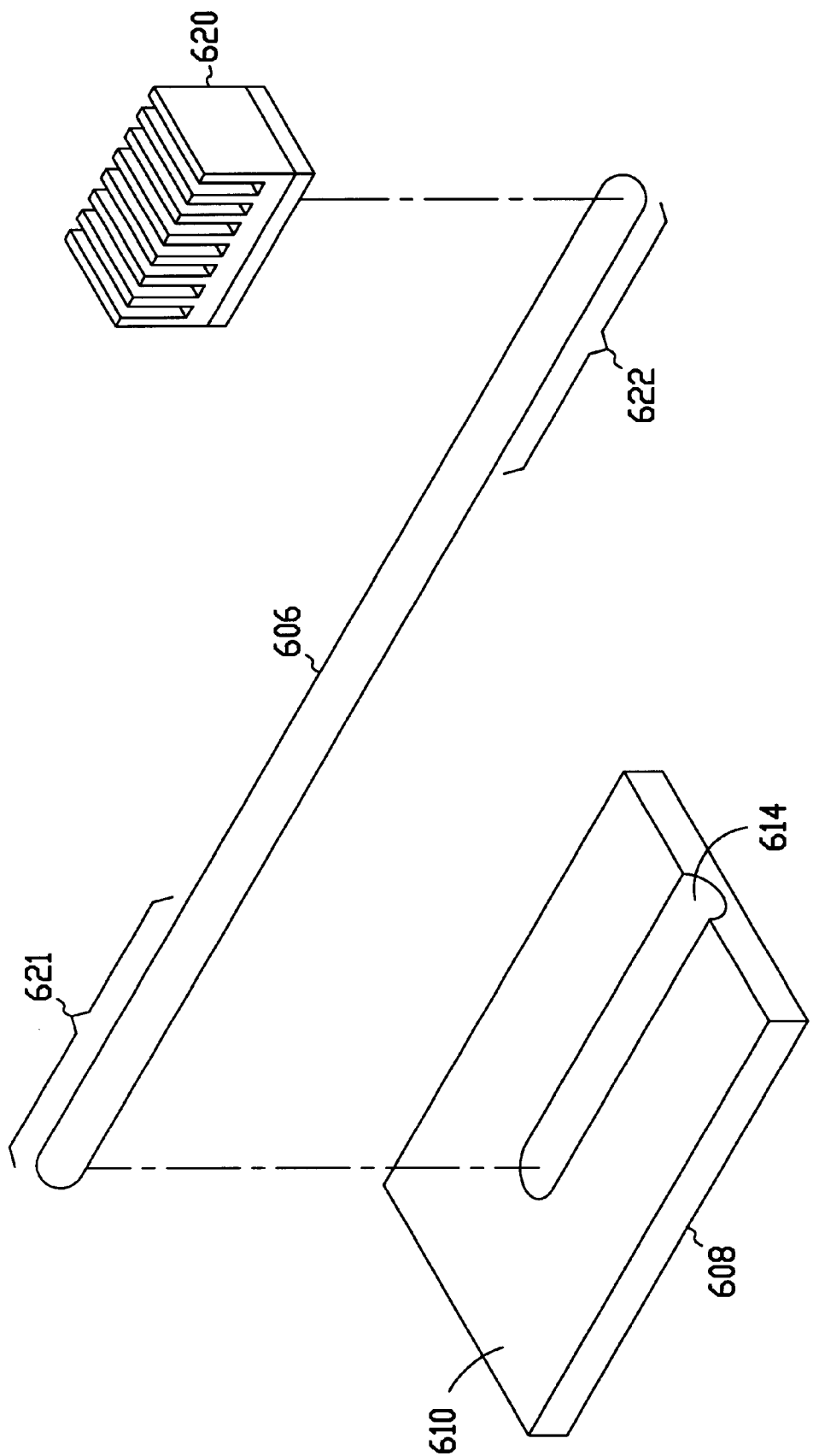

FIG. 8 shows an exploded view of a heat sink, a heat pipe, and a heat-spreading plate in one embodiment of the arrangement in FIG. 7.

Figure 9:
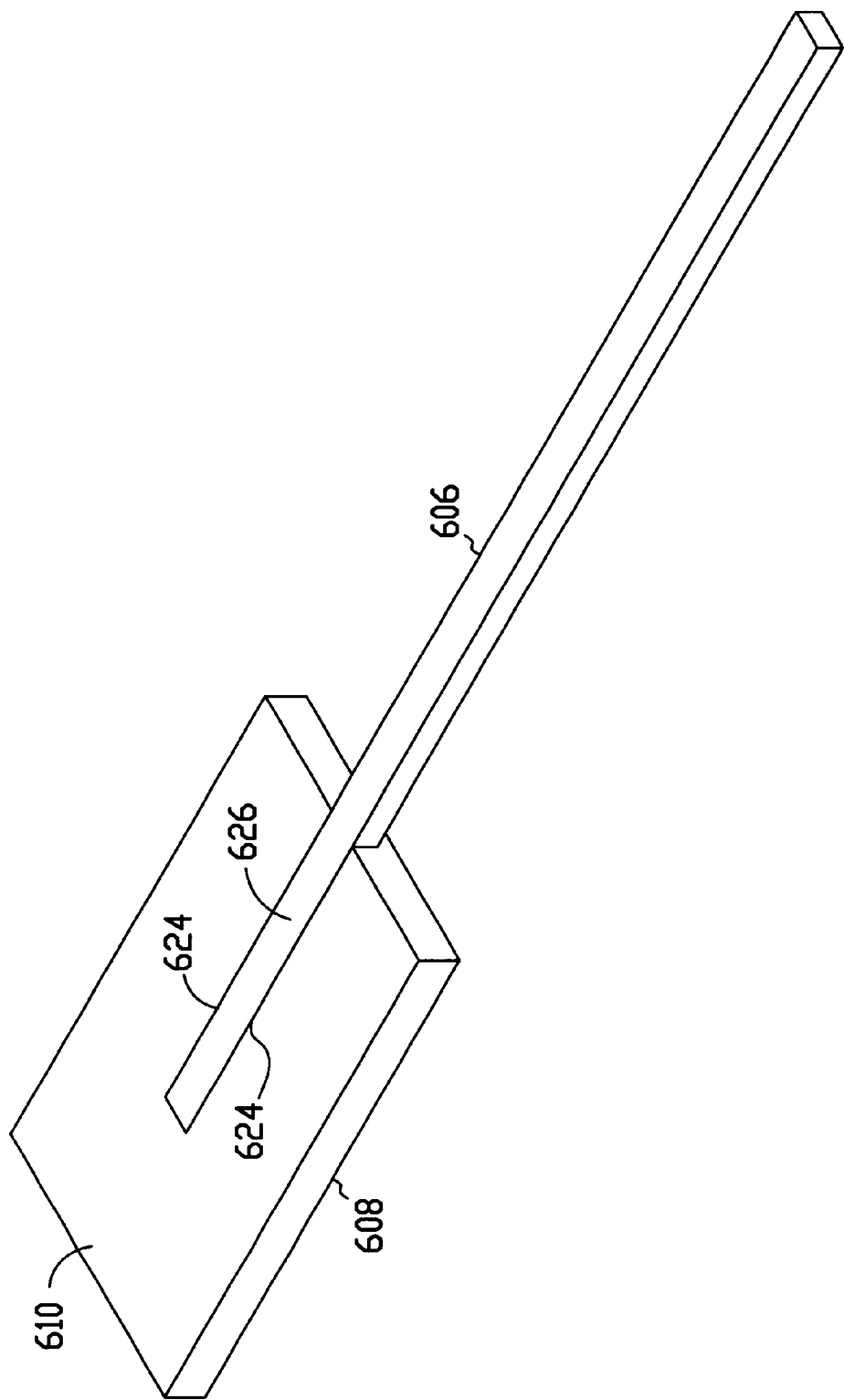

FIG. 9 shows a perspective view of a heat pipe and a heat-spreading plate in one embodiment of the arrangement in FIG. 7.

Figure 10:
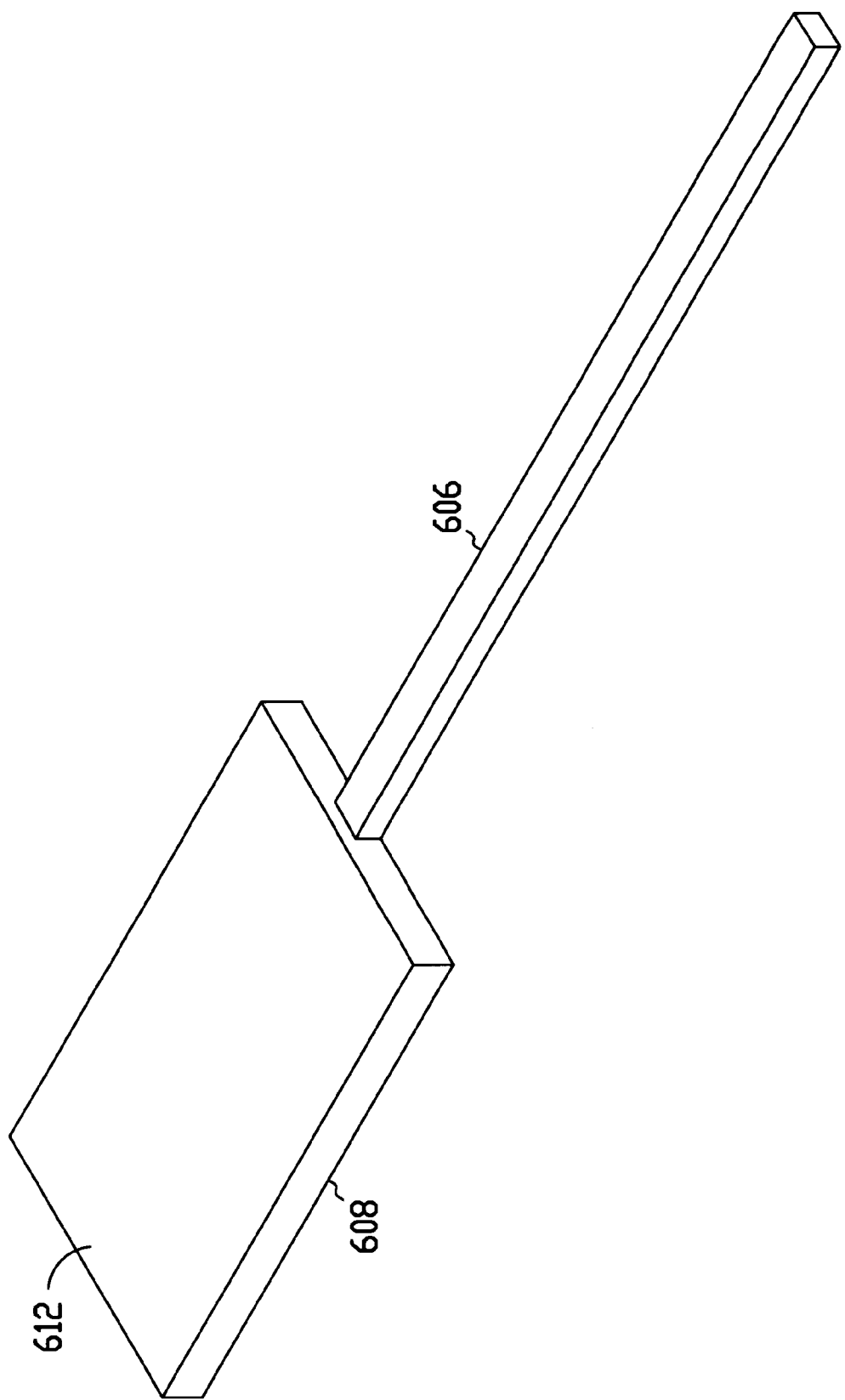

FIG. 10 shows another perspective view of a heat pipe and a heat-spreading plate in one embodiment of the arrangement in FIG. 7.

Figure 11:
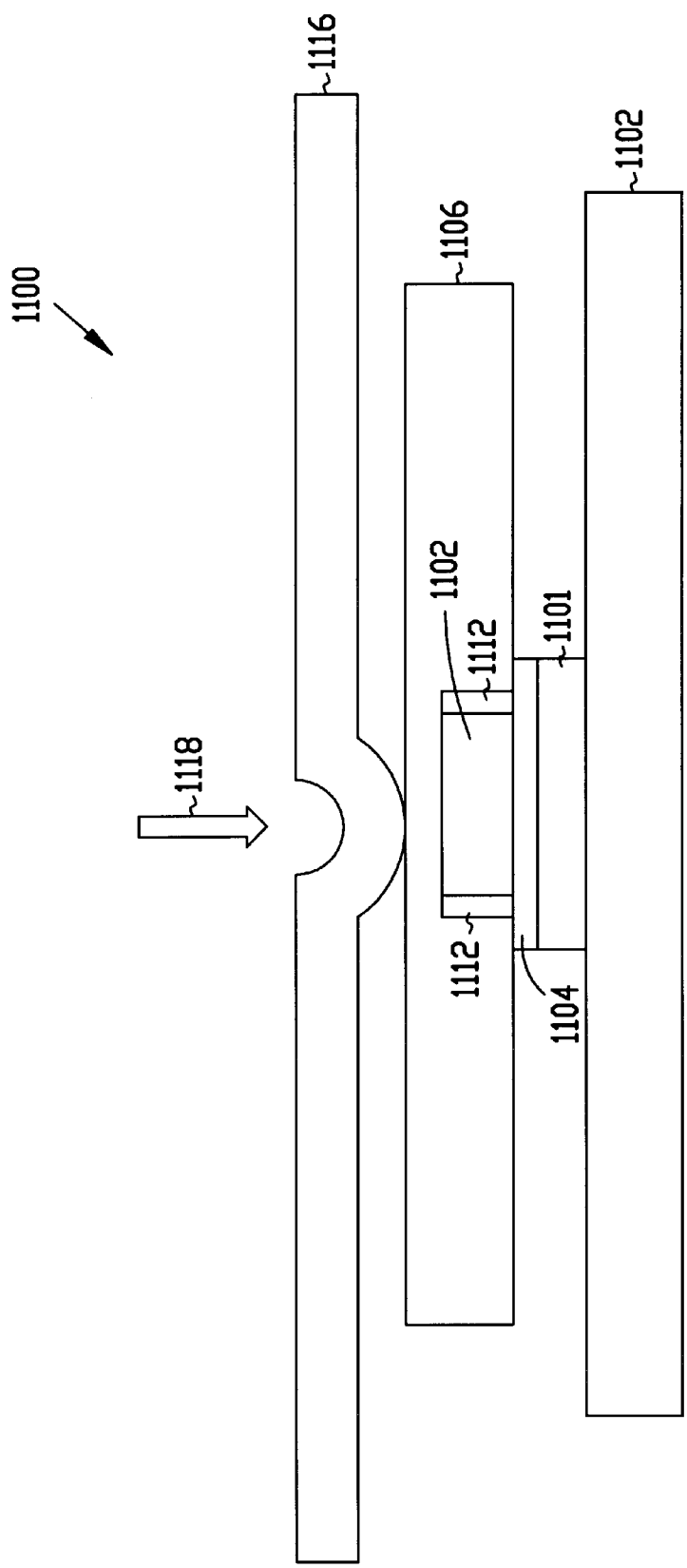

FIG. 11 shows a cross-section view of one embodiment of an embedded direct heat pipe attachment.

Figure 12:
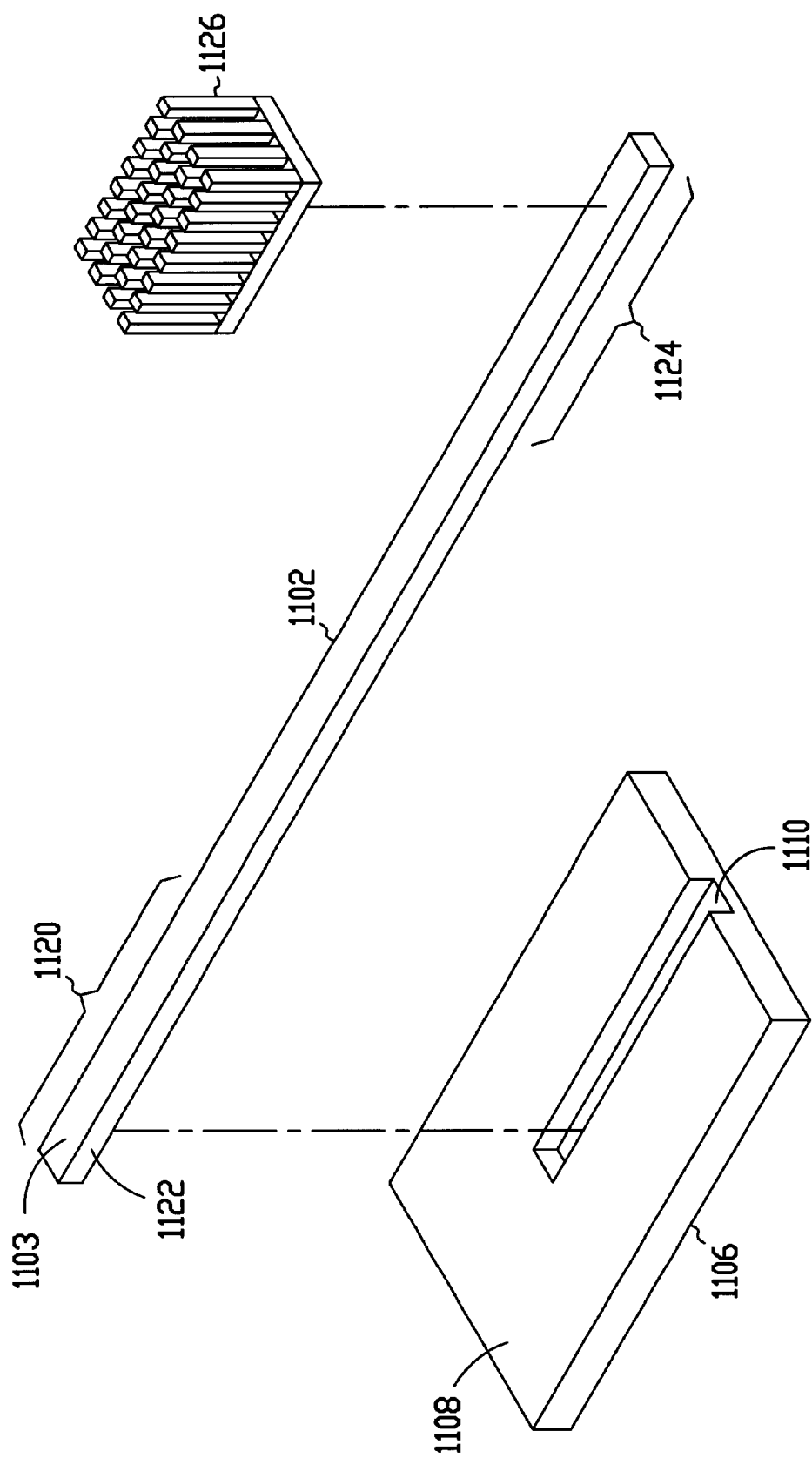

FIG. 12 shows an exploded view of a heat sink, a heat pipe, and a spreader plate of the embedded direct heat pipe attachment in FIG. 11.

Figure 13:
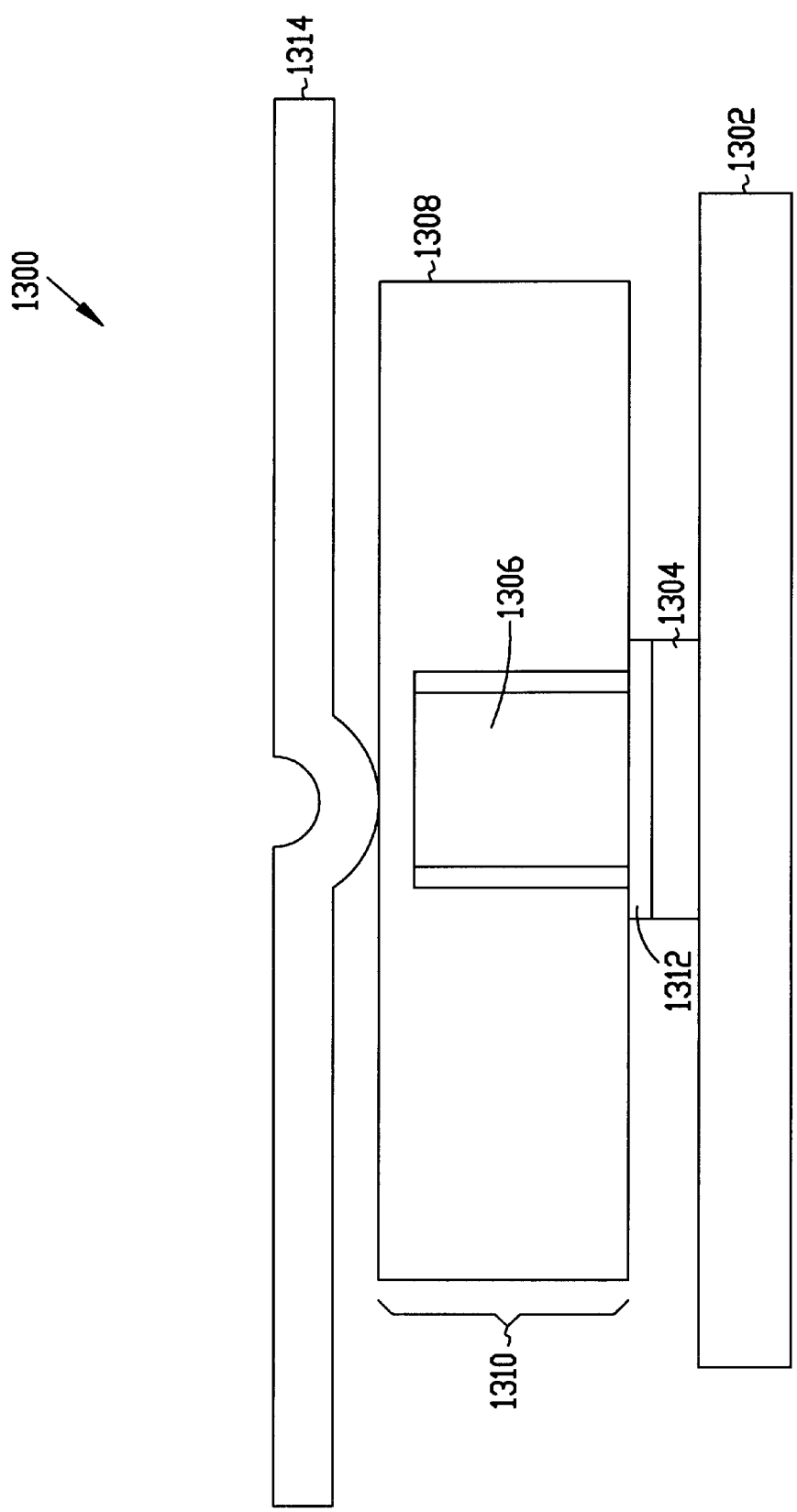

FIG. 13 shows a cross-section view of one embodiment of an electronic assembly.

Figure 14:
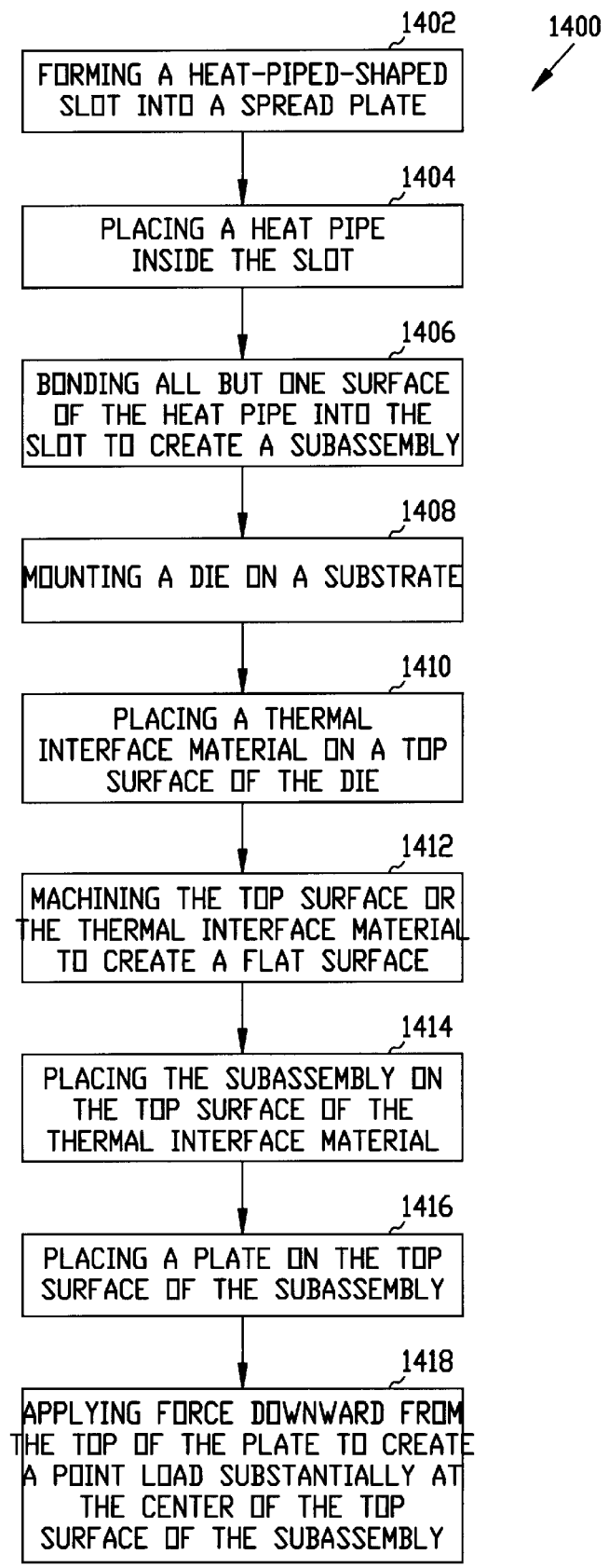

FIG. 14 shows a flow chart of one embodiment of a method of assembling an embedded direct heat pipe attachment.

Prior Art

Figure 15:
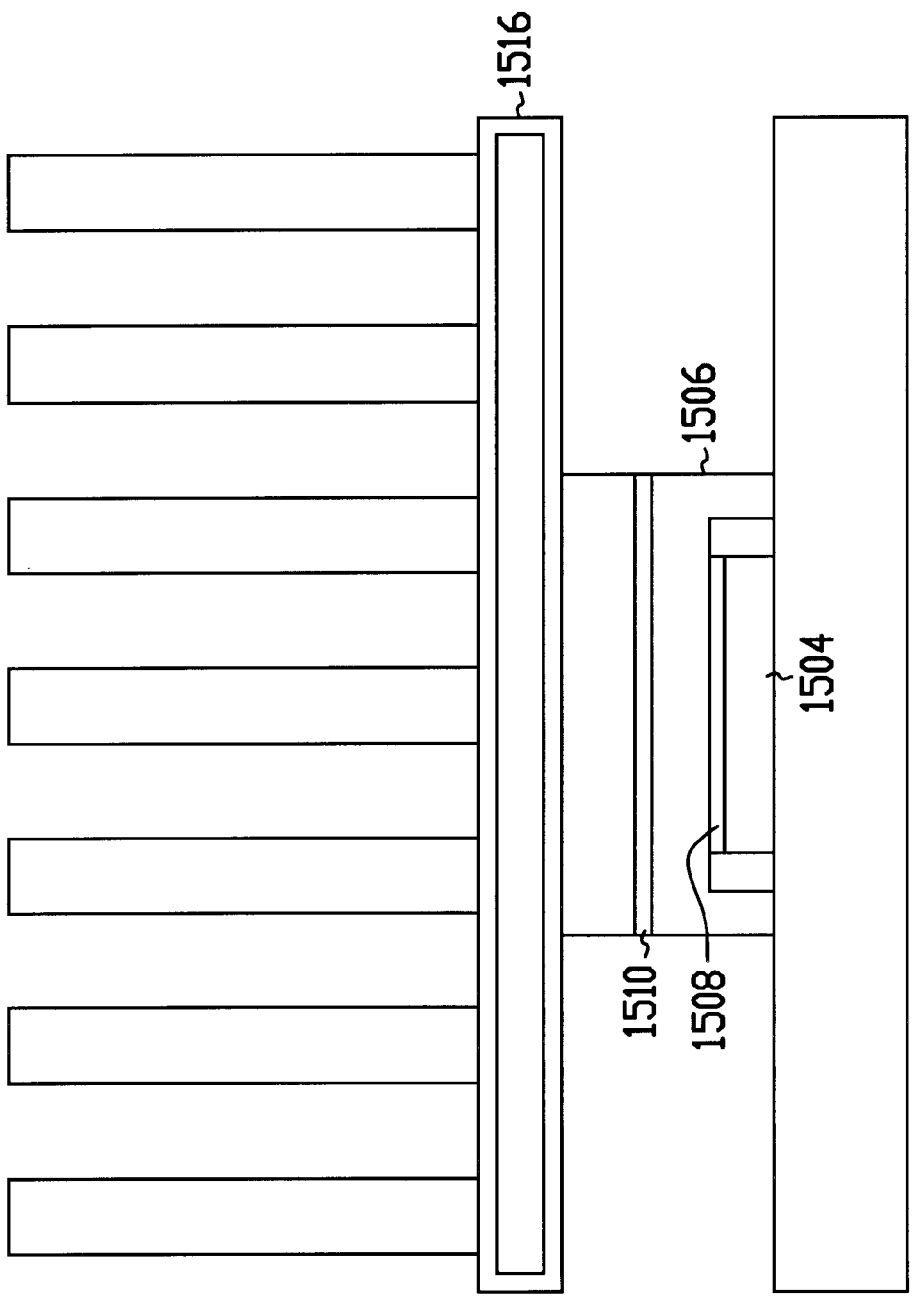

FIG. 15 shows a cross-section view of a prior art heat sink and spreader.

Figure 16:
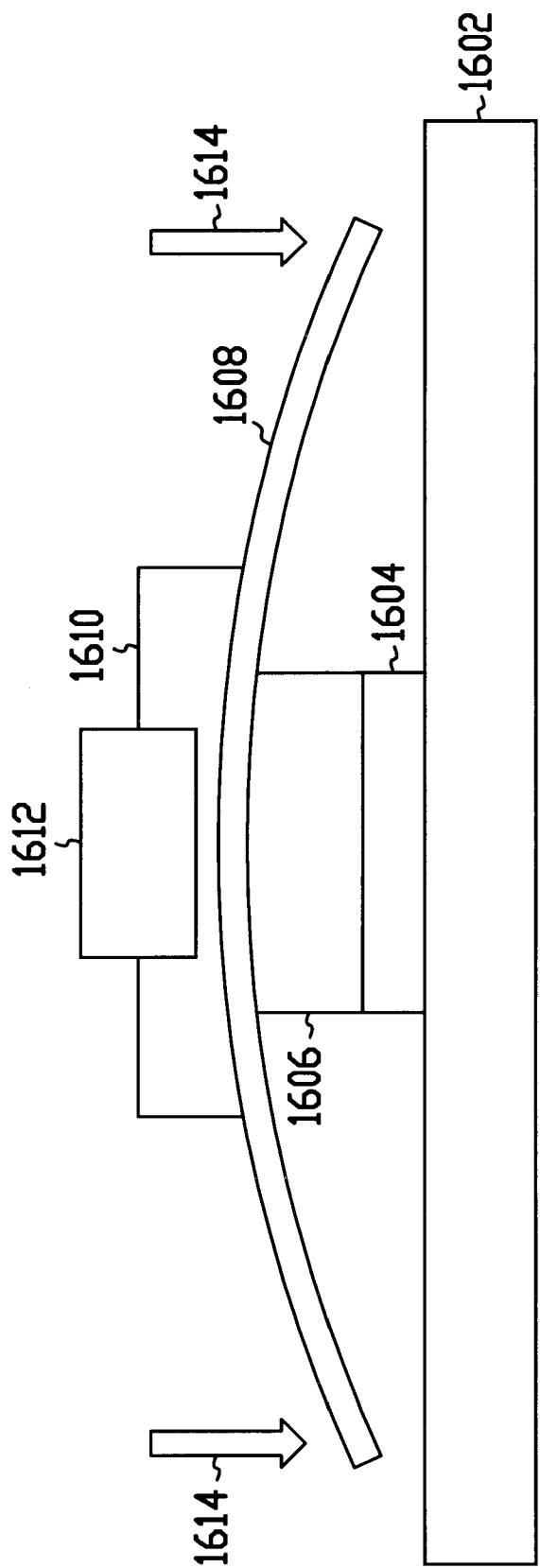

FIG. 16 shows a cross-section view of a prior art heat pipe and heat spreader.

DETAILED DESCRIPTION

In the following detailed description of the invention reference is made to the accompanying drawings which form a part hereof, and in which is shown, by way of illustration, specific embodiments in which the inventions may be practiced. In the drawings, like numerals describe substantially similar components throughout the several views. These embodiments are described in sufficient detail to enable those skilled in the art to practice the inventions. Other embodiments may be utilized and structural, logical, and electrical changes may be made without departing from the scope of the present inventions.

An Integrated Vapor Chamber Heat Sink and Spreader

An integrated heat sink and spreader for thermal management is described herein. The integrated heat sink and spreader efficiently dissipates the heat generated by high power electronic devices, such as desktop and server computers.

FIG. 1 shows a perspective view of one embodiment of an integrated heat sink and spreader 100. An integrated heat sink and spreader 100 for cooling an item 102 comprises a vapor chamber heat sink 104 and a plurality of heat-radiating fins 110. The item 102 is any heat-generating item, such as a processor for a desktop or server computer.

Figure 2:
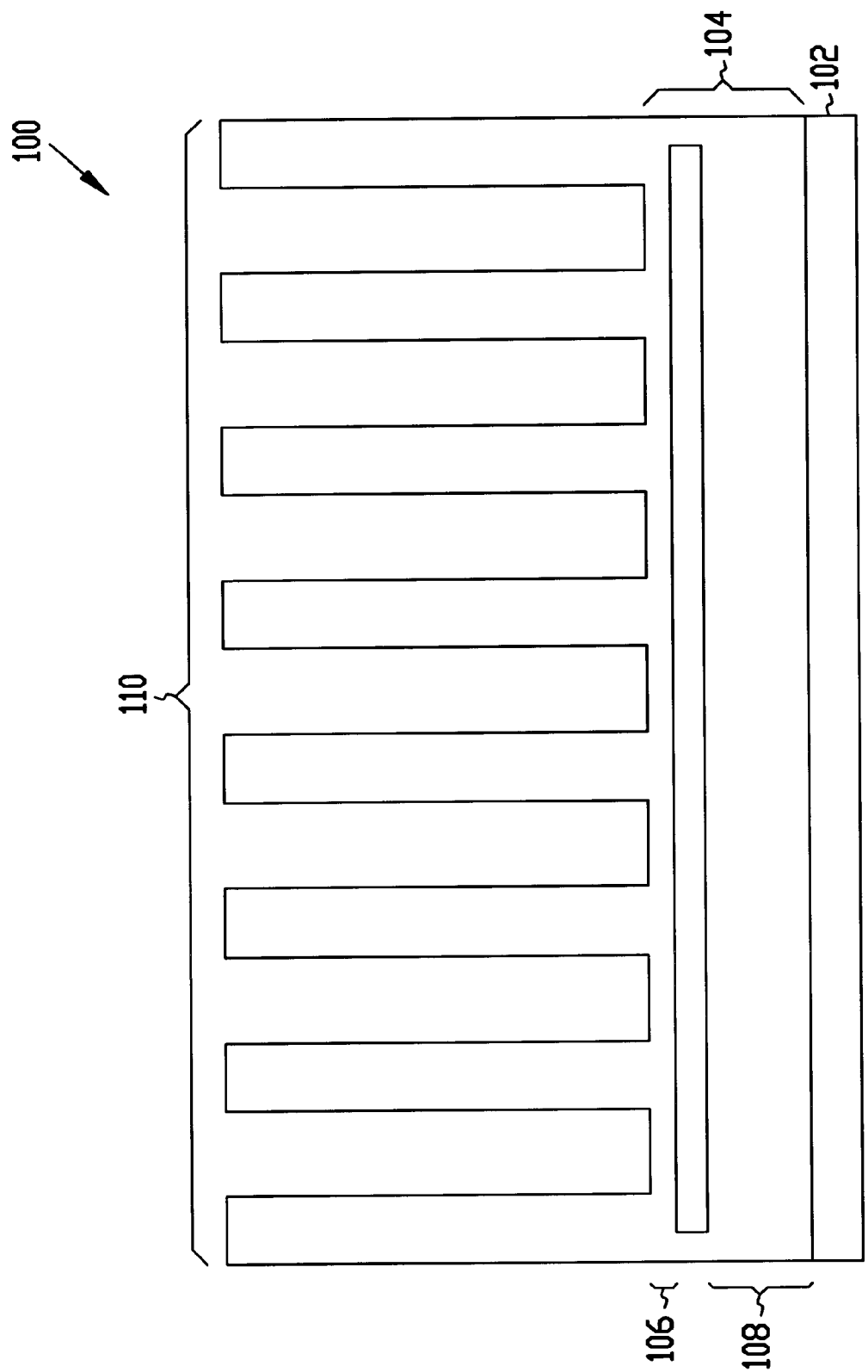
FIG. 2 shows a cross-section view of the integrated heat sink and spreader in FIG. 1.

FIG. 2 shows a cross-section view of the integrated heat sink and spreader 100 in FIG. 1. As shown in FIG. 2, the vapor chamber heat sink 104 is defined by a thinner first wall 106 and a thicker second wall 108, the thicker second wall 108 being engageable with the item 102 in efficient heat transferring relationship. An efficient heat transferring relationship is one where the orientation and relative sizes are such that most of the heat generated by the item 102 is transferred and the thermal resistance is low. One efficient heat transferring relationship is direct thermal contact with the item 102 through a thin layer of thermal interface material. Some examples of thermal interface material are: solder, air, helium, polymer adhesive, silicone grease, silicone rubber, and thermal paste. A plurality of heat-radiating fins 110 are attached to the thinner first wall 106 of the integrated heat sink and spreader 100. The heat-radiating fins 110 provide extended surfaces for heat transfer to the surrounding air. The fins 110 may be any type, including plate fins, serrated fins, pin fins, or disc fins. The fins 110 may be attached to the thinner first wall 106 with solder, air, helium, polymer adhesive, silicone grease, silicone rubber, thermal paste, or the like.

The integrated heat sink and spreader 100 may be either active or passive. Active heat sinks consist of a heat sink with a fan mounted directly to the heat sink. In an active heat sink, the fan blows air on the fins and base of the heat sink and provides cooling via air impingement. The use of active heat sinks is widespread in desktop computers. Passive heat sinks, on the other hand, are cooled by air flow across the heat sink fins. The air flow is usually provided by one or more system fans and may sometimes be ducted from the fan face to the heat sink. Passive heat sinks with or without ducted air flow are used widely in workstation and server computers. In addition, the integrated heat sink and spreader 100 may be an extruded heat sink, a folded-fin heat sink, an integrated vapor-chamber heat sinks, or any other type of heat sink.

Figure 3:
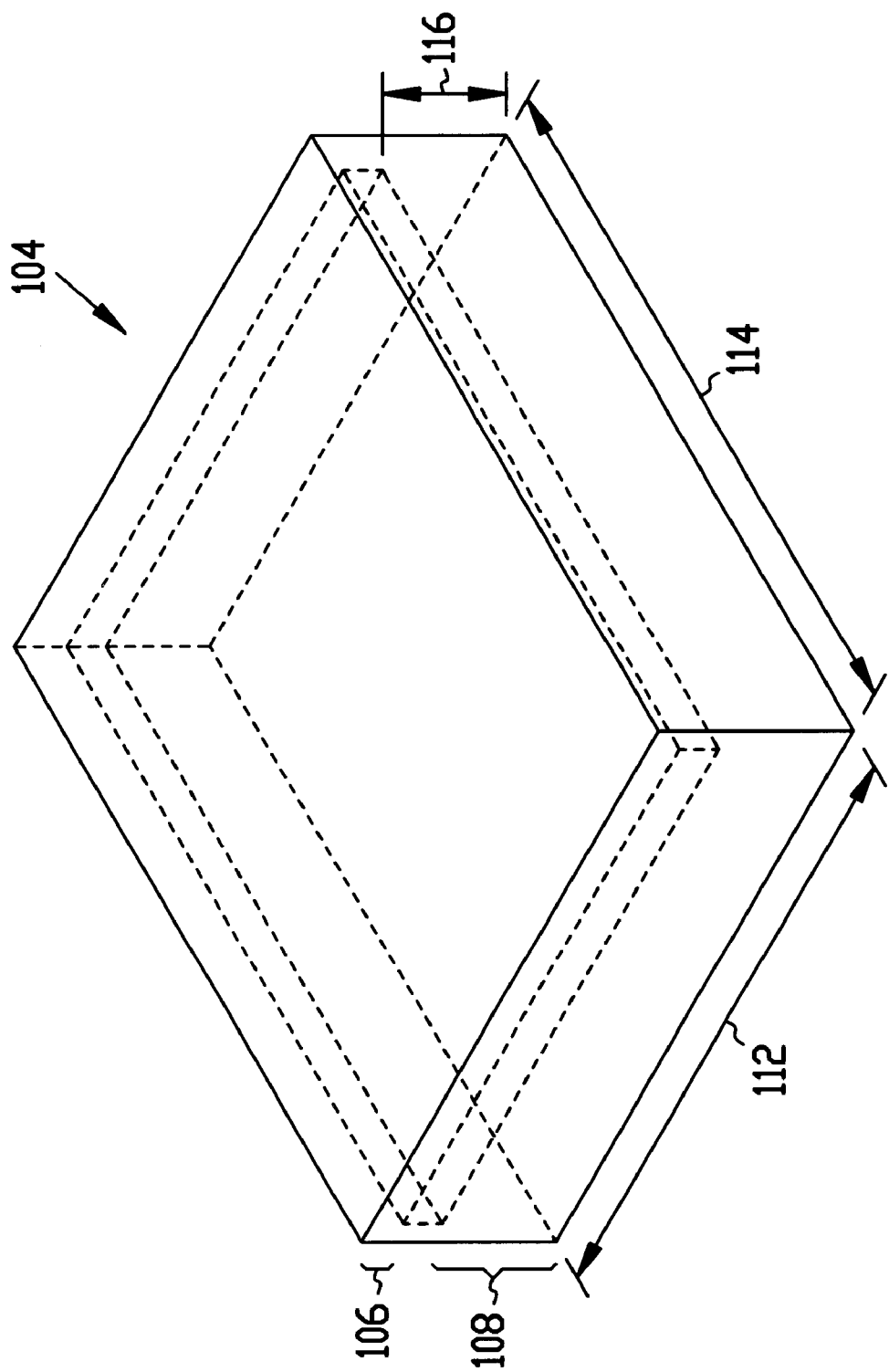
FIG. 3 shows a perspective view of a vapor chamber heat sink in one embodiment of the integrated heat sink and spreader in FIG. 2.

FIG. 3 shows a perspective view of a vapor chamber heat sink 104 in one embodiment of the integrated heat sink and spreader 100 in FIG. 2. In one embodiment, the thicker second wall 108 is at least twice as thick as the thinner first wall 106, as shown in FIG. 3. For example, the thicker second wall 108 may have a thickness of about 2 to 3 millimeters and the thinner first wall 106 may have a thickness of about 1 to 1.5 millimeters.

In one embodiment, the integrated heat sink and spreader 100 (shown in FIG. 2) has a thicker second wall 108 with a height 116 and a base surface area defined by a width 112 and a length 114, as shown in FIG. 3. The base surface area is large enough to spread heat substantially uniformly across the base surface area. Also, the base surface area is engageable with the item 102 (shown in FIG. 2). As shown in FIG. 3, the height 116 of the thicker second wall 108 is small enough to efficiently transfer heat. Together, the base surface area and height 116 minimize total thermal resistance. For example, the integrated heat sink and spreader 100 may have a width of at least about 5 centimeters and a length of at least about 6 centimeters, resulting in a base surface area of about 5×6=30 centimeters. In one embodiment, the base surface area is at least as large as the surface area of the item 102 engageable with the base surface area. For example, the base surface area may be the size of the footprint of the item 102. Advantageously, the base surface area is small enough for mobile electronic devices and, at the same time, large enough to increase the heat spreading and cooling without increasing the total thermal resistance. In general, the total thermal resistance is given by $\Sigma R=\Sigma(L/(kA))$, where L is height, k is thermal conductivity, and A is the effective area. Thermal resistance is usually measured from the junction at the surface of the item 102 to the ambient air. Preferably, the integrated heat sink and spreader minimize total thermal resistance, including an optimal base surface area and corresponding height 116. Given the equation, there are a range of acceptable shapes and sizes that will minimize total thermal resistance.

Figure 4:
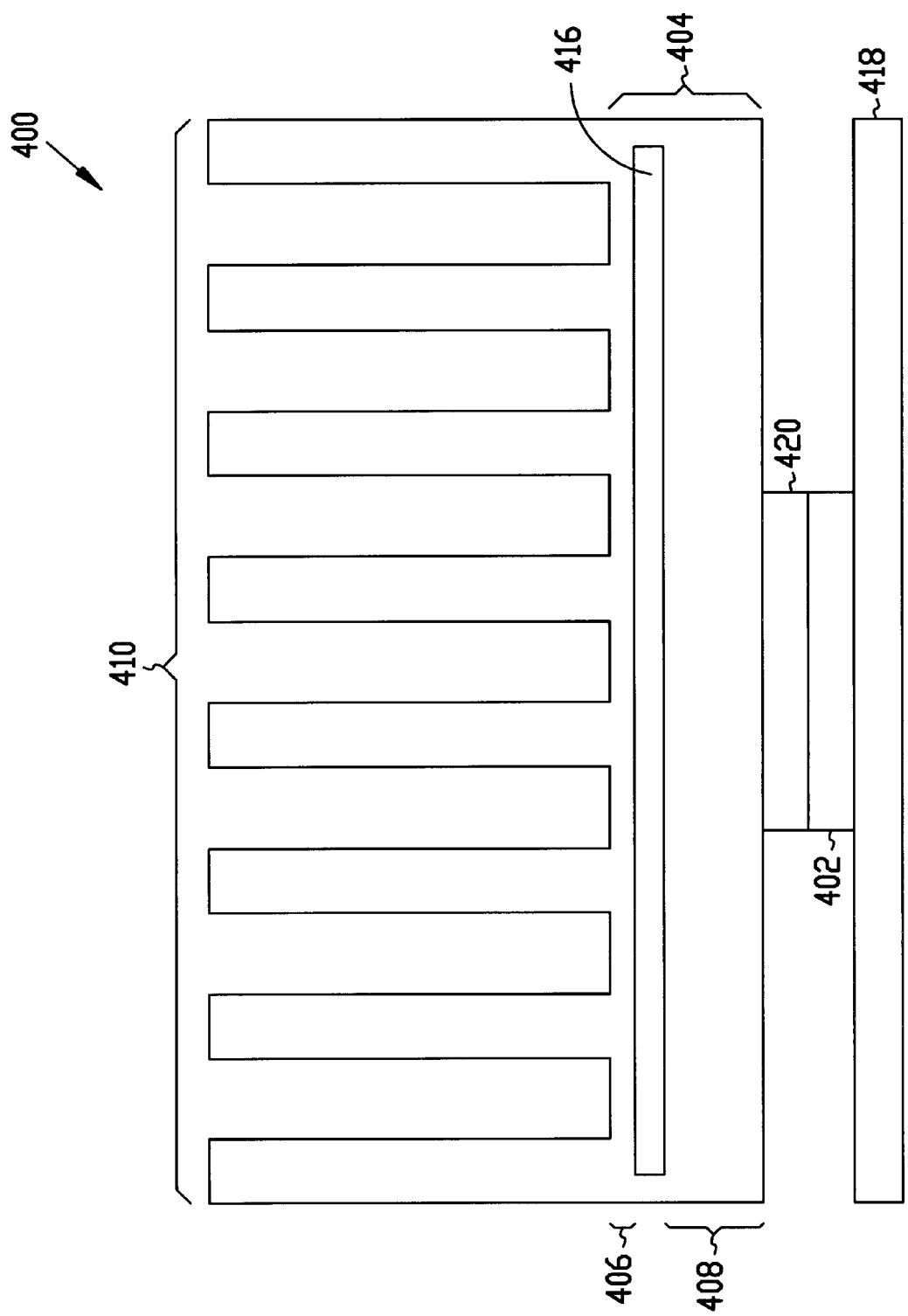
FIG. 4 shows a cross-section view of one embodiment of a vapor chamber heat sink.

FIG. 4 shows a cross-section view of one embodiment of a vapor chamber heat sink 400. A vapor chamber heat sink 400 for conducting heat away from an item 402 mounted to a substrate 418 comprises a hollow vapor chamber base 404 and a plurality of fins 410. Thermal interface material 420 is interposed between the item 402 and the hollow vapor chamber base 404. The hollow vapor chamber base 404 has a chamber 416. The hollow vapor chamber base 404 has a thinner first wall 406 and a thicker second wall 408. The plurality of fins 410 are bonded to the thinner first wall 406 to form a heat sink. The thicker second wall 408 has a surface area contactable with the item 402 that is sufficiently large to spread the heat generated by the item 402.

Figure 5:
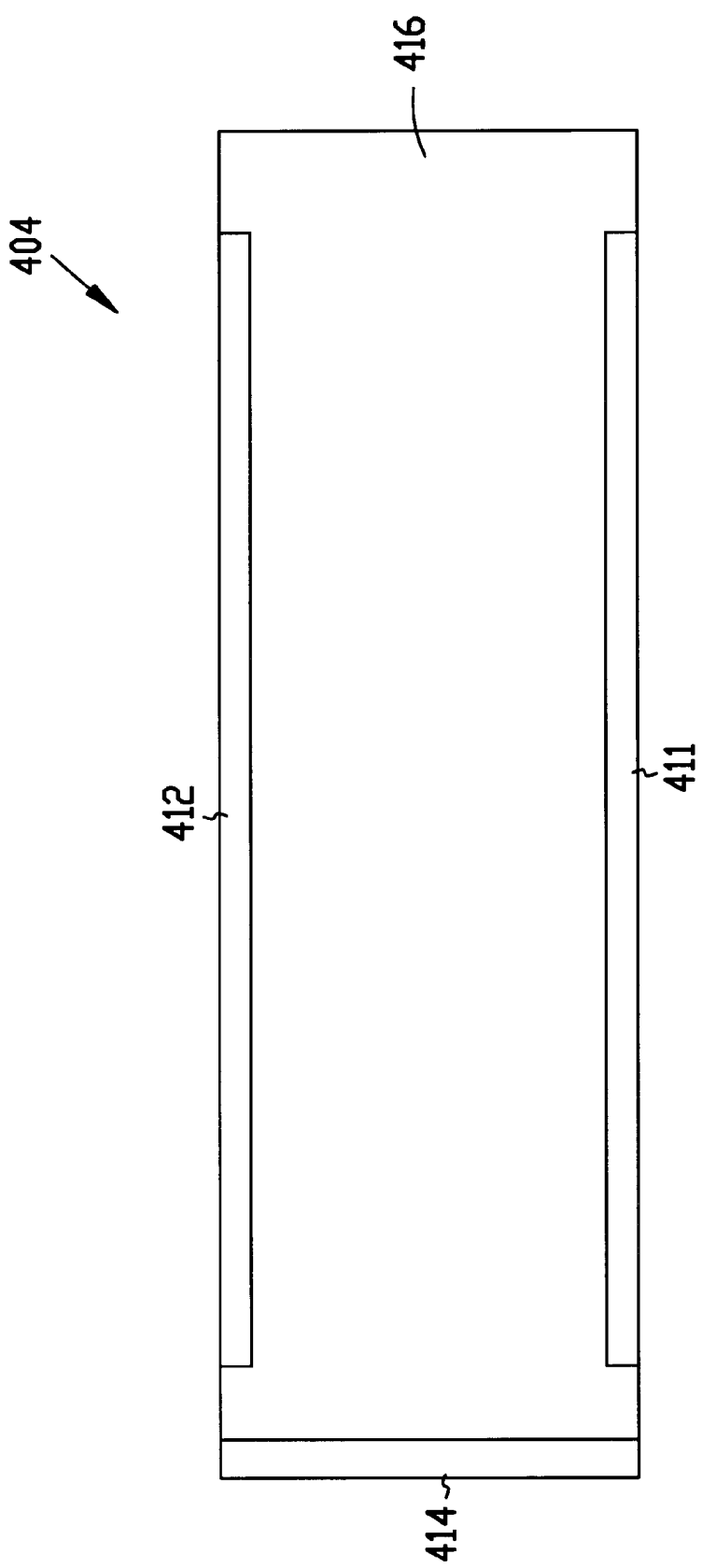
FIG. 5 shows a cross-section view of a hollow vapor chamber base in one embodiment of the vapor chamber heat sink in FIG. 4.

FIG. 5 shows a cross-section view of a hollow vapor chamber base 404 in one embodiment of the vapor chamber heat sink 400 shown in FIG. 4. As shown in FIG. 5, the hollow vapor chamber base 404 includes a fluid under pressure within a chamber 416, an evaporator 411, a condenser 412, and a wick 414. The evaporator 411 is associated with the thicker second wall 408 (shown in FIG. 4) and vaporizes the fluid. The condenser 412 is associated with the thinner first wall 406 (shown in FIG. 4) and condenses the fluid. The wick 414 returns the fluid to the evaporator 411. The wick may be placed anywhere that provides a return path from the condenser 412 to the evaporator 411 and is a design decision.

A typical vapor chamber heat sink consists of an evaporator 411, an adiabatic section, and a condenser 412. Fluid vaporizes in the evaporator 411 and condenses in the condenser 412. In an electronic device, the evaporator 411 is placed in contact with a heat-generating item, and the condenser 412 is cooled by forced convection. Since the evaporation and condensation temperatures are identical, an ideal heat pipe would move heat from the hot to the cold regions with negligible temperature drops. When a vapor chamber and fins are combined, the resulting heat sink consists of a hollow vapor chamber base that functions like a heat pipe. Typical heat sink thermal resistances of 0.2 to 0.4° C./Watt can be expected using a vapor chamber with fins heat sink at an air flow rate of 15 to 20 cfm, where cfm is the volumetric flow rate of a liquid or gas in cubic feet per minute.

Referring back to FIG. 4, in one embodiment, the vapor chamber heat sink 400 further comprises a top surface of the item 402 integrated with the hollow vapor chamber base 404, a bottom surface of the item 402 attached to a substrate 418, and a layer of thermal interface material 420 interposed between the item 402 and the hollow vapor chamber base 404. The thickness of the thermal interface material 420 is highly exaggerated in FIG. 4 and other figures. Thermal interface material is usually a thin layer of material that produces intimate, poreless thermal contact. The substrate 418 is any kind of carrier, such as a circuit board, a motherboard or a test board.

In one embodiment, the thermal resistance between the item 402 and the vapor chamber heat sink base 404 is less than about 0.26° C./Watt. In one embodiment, the vapor chamber heat sink base 404 is capable of efficiently cooling an item 402 having a power of at least 190 Watts. With uniform heating, a numeric simulation indicated that the present invention was capable of handling 190 Watt, while the prior art was only capable of handling 130 Watt. The thermal resistance of the present invention between the die and the vapor chamber heat sink was about 0.26° C./Watt, while the thermal resistance of the prior art was about 0.38° C./Watt. The calculation (190 Watt–130 Watt)/130 Watt= 0.46 shows about a 50% increase in power handling capacity.

Referring to both FIGS. 4 and 5, in one embodiment, a heat sink 400 for controlling the temperature of a heat-producing item 402, comprises a heat pipe 404 and a plurality of heat-dissipating fins 410. The heat pipe 404 includes a thinner first wall 406 and a thicker second wall 408. The thicker second wall 408 is contactable with the item 402 in efficient heat-transferring relationship. The walls define a chamber 416. The chamber 416 has a vaporizing region 411 proximate the thicker second wall 408, and a condensing region 412 proximate the thinner first wall 406. The exterior of the thicker second wall 408 has a size and topography relative to the item 402 and a sufficient thickness to efficiently absorb and spread heat from the item 402 and to efficiently apply such absorbed and spread heat to the vaporizing region 411. The plurality of heat-dissipating fins 410 are in efficient heat-transferring relationship with the exterior of the thinner first wall 406. The fins 410 have a cumulative surface area sufficiently large to efficiently dissipate heat transferred to the fins 410 through the thinner first wall 406 from the condensing region 412. In one embodiment, the thicker second wall 408 is at least twice as thick as the thinner first wall 406. In one embodiment, the item 402 has an exposed surface. The exterior of the thicker second wall 408 is adapted to contact the exposed surface of the item 402 in efficient heat-transferring relationship. The area of the exterior of the thicker second wall 408 is sufficiently larger than the area of the item's exposed surface to effect the spreading of heat transferred from the item's exposed surface to the exterior of the thicker second wall 408. This spreading of heat is done efficiently throughout the thicker second wall 408 and from there to the vaporizing region 411.

The integrated vapor chamber heat sink and spreader has many advantages over prior art thermal designs, such as the one shown in FIG. 15, including efficient heat dissipation for high power microprocessors and lower total thermal resistance. The integrated vapor chamber heat sink has less thermal resistance than prior art thermal designs by eliminating a layer of thermal interface material and a pedestal. Heat is more efficiently dissipated, since there is a smaller distance from the heat-generating item to the heat sink. Additionally, more area is available for heat transfer, decreasing the thermal resistance internal to the heat sink. About 50% more power is dissipated and up to 190 Watts of power can be dissipated efficiently. Also, thermal resistance is reduced by placing the heat sink directly in thermal contact with the heat-generating item and increasing the effective area of heat transfer. As a result, there is more uniform heat spreading across the heat sink.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

An Embedded Direct Heat Pipe Attachment

An embedded direct heat pipe attachment is described herein. The embedded direct heat pipe attachment effectively dissipates the heat generated by small and thin high performance electronic devices, such as telephones, radios, laptop computers, handheld computers, and other mobile applications.

FIG. 6 shows a perspective view of one embodiment of an arrangement 600 for pressing a heat-generating item against a substrate while ensuring that a compressible and easily damaged heat pipe 606 is not damaged. A portion of the heat pipe 606 is embedded in a spreader plate 608. Preferably, the heat pipe 606 has a thin profile less than 2 millimeters. In one embodiment, a heat sink 620 is attached a portion of the heat pipe 606.

FIG. 7 shows a cross-section view of the arrangement 600 in FIG. 1. The heat pipe 606 is capable of being thermally coupled to the heat-generating item 602. In one embodiment, thermal interface material 628 thermally couples the heat pipe 606 to the heat-generating item 602. The heat-generating item 602 may be a high power microprocessor for a telephone, radio, laptop computer, handheld device or any other high power electronic component. In one embodiment, a heat sink 620 is attached an end portion 622 of the heat pipe 606.

FIGS. 8–10 show detailed features of various elements of the arrangement 600 in FIG. 7. FIG. 8 shows an exploded view of a heat sink 620, a heat pipe 606, and a heat-spreading plate 608. FIGS. 9 and 10 show top and bottom perspective views of a heat pipe 606 and a heat-spreading plate 608. The arrangement 600 (shown in FIG. 7) comprises an essentially incompressible heat-spreading plate 608, a groove 614 (shown in FIG. 8), and facilities 618 (shown in FIG. 7) for applying a force 616 (shown in FIG. 7). The essentially incompressible heat-spreading plate 608 has a first surface 610 (shown in FIG. 8) engageable with the heat-generating item 602 (shown in FIG. 7) and a second surface 612 (shown in FIG. 10) opposed to the first surface 610 (shown in FIG. 8). The heat-spreading plate may be a copper shell or the like. As shown in FIG. 8, the groove 614 is formed in the first surface 610 of the heat-spreading plate 608 for receiving a first end portion 621 of the heat pipe 606. The groove 614 has a depth which is substantially the same as or slightly greater than the thickness of the heat pipe 606.

In FIG. 7, a force 616 applied to the second surface 612 (shown in FIG. 10) of the heat spreading plate 608 presses the heat-generating item 602 against the substrate 604 and the force 616 has limited compressive effect on the heat pipe 606. The facilities 618 for applying the force 616 to the second surface 610 (shown in FIG. 9) of the heat-spreading plate 608 presses the heat-generating item 602 against the substrate 604. The force 616 is directed substantially at the center of the heat-generating item 602. In one embodiment, a portion of the heat-spreading plate 608 is in contact with the heat-generating item 602 on at least two sides of the heat pipe 606 adding extra protection from damage. Thus, the heat pipe 606 embedded in the heat-spreading plate 608 is protected from caving in under the pressure of the force 616 or other damage.

FIG. 9 shows a perspective view of a heat pipe 606 and a heat-spreading plate 608 in one embodiment of the arrangement 600 in FIG. 7. In FIG. 9, the heat pipe is shown embedded into the groove 614 (shown in FIG. 8) of the heat-spreading plate 608. In one embodiment, the arrangement 600 (shown in FIG. 7) further comprises means for bonding 624 the first end portion 621 (shown in FIG. 8) of the heat pipe 606 into the groove 614 (shown in FIG. 8) so that an exposed surface 626 of the heat pipe 606 is substantially even with the first surface 610 of the heat-spreading plate 608. As shown in FIG. 7, the heat pipe 606 is capable of being thermally coupled to the heat-generating item 602. The means for bonding 624 may be solder, epoxy, brazing or the like.

By embedding the heat pipe 606 in the heat-spreading plate 608 and putting it in direct contact with a heat-generating item 602, the thermal resistance is low enough to effectively dissipate power for high power mobile computers. This is an advantage over the prior art, such as that shown in FIG. 16. Also, the thermal resistance is lowered by decreasing the amount of solder 1610 around the heat pipe 1612 in the prior art and moving the heat pipe 1612 closer to the heat-generating item 1604.

In FIG. 7, one embodiment of the arrangement 600 further comprises thermal interface material 628 interposeable between the heat pipe 606 and the heat-generating item 602. The thermal interface material is capable of thermally coupling the heat pipe 606 to the heat-generating item 602. Some examples of thermal interface material are: solder, air, helium, polymer adhesive, silicone grease, silicone rubber, and thermal paste. In one embodiment, the facilities 618 for applying the force 616 directed substantially at the center of the heat-generating item presses the thermal interface material 628 into a layer of substantially uniform thickness. In the prior art, shown in FIG. 16, corner loading caused unbalanced loads which caused tilt between the heat-generating item 1604 and the heat-spreading plate 1608 which lead to large variations in bond line thickness of the thermal interface material 1606. The substantially uniform thickness of the thermal interface material 628 decreases thermal resistance over the prior art.

FIG. 11 shows a cross-section view of one embodiment of an embedded direct heat pipe attachment 1100. FIG. 11 shows an embedded direct heat pipe attachment 1100 for providing low thermal resistance for cooling a heat-generating component 1101 in a mobile electronic device. The heat-generating component 1101 is mounted to a carrier 1102, such as a circuit board. The embedded direct heat pipe attachment 1100 comprises a heat pipe 1102, thermal interface material 1104, a spreader plate 1106, and bonding means 1112. In one embodiment, a spring plate 1116 applies a point load 1118 substantially at the center of the embedded direct heat pipe attachment 1100.

FIG. 12 shows an exploded view of a heat sink 1126, a heat pipe 1102, and a spreader plate 1106 of the embedded direct heat pipe attachment 1100 in FIG. 11. The heat pipe 1102 has at least one exposed surface 1103. The exposed surface 1103 is substantially flat and capable of being thermally coupled to the heat-generating component 1101 (shown in FIG. 11). In FIG. 11, the thermal interface material 1104 thermally couples the heat pipe 1102 to the heat-generating component 1101. In one embodiment, the bonding means is selected from the group consisting of solder and epoxy. In FIG. 12, the spreader plate 1106 has a surface 1108, shown in FIG. 12. The surface 1108 is substantially flat except where it defines a recess 1110 capable of receiving all but the exposed surface 1103 of the heat pipe 1102. In one embodiment, the heat pipe 1102 includes a first end portion 1120, a surface opposite the exposed surface (not shown), a first side 1122 of the end portion 1120 and a second side opposite the first side (not shown). In one embodiment, the bonding means is applied to the first end portion 1120 only on the first 1122 side and second side (not shown) of the first end portion 1120. In another embodiment, the heat pipe 1102 is a remote heat exchanger which includes a second end portion 1124 opposite the first end portion 1120 and a heat sink 1126 thermally coupled to the second end portion 1124. The heat pipe may be long enough so that heat can be directed towards a fan or other air flow located a distance from the heat-generating item.

FIG. 13 shows a cross-section view of one embodiment of an electronic assembly. An electronic assembly 1300 comprises a substrate 1302, a die 1304, a heat pipe 1306, a spreader plate 1308, a subassembly 1310, thermal interface material 1312, and a plate 1314. The die 1304 has a top and is mounted on the substrate 1302. The spreader plate 1308 defines a recess capable of receiving the heat pipe 1306. The subassembly 1310 includes the heat pipe 1306 bonded into the recess of the spreader plate 1308 so that the subassembly 1310 is capable of being thermally coupled directly to the die 1304. Thermal interface material 1312 for thermally coupling the die 1304 to the subassembly 1310 puts the heat pipe 1306 inn direct contact with the die 1304. The plate 1314 applies a point load 1316 substantially at the center of the subassembly 1310. In one embodiment, the total height of the electronic assembly 1300 is minimized. For example, the heat pipe may have a height of about 2 millimeters and the total height may be about 4.5 to 5 millimeters. A small stack height is advantageous in thin, mobile devices, such as telephones, radios, laptop computers, handheld devices. A small stack height provides a compact design as well as decreased thermal resistance.

In one embodiment, the spreader plate 1308 spreads the pressure form the point load 1316 so that the heat pipe 1306 is not deformed and the thermal interface material 1310 is pressed into a very thin layer of substantially uniform thickness. In one embodiment, the subassembly 1310 is thermally coupled to the die 1304 so that about 80% of the heat from the die 1304 is conducted away by the heat pipe 1306 and about 20% of the heat is conducted away by the spreader plate 1308. The spreader plate 1308 may be in thermal contact with the die 1304 around the heat pipe 1306.

In one embodiment, a thermal resistance at the point where the heat pipe 1306 and the die 1304 engage one another is less than about 0.8° C./Watt. The electronic assembly 1300 reduces the thermal resistance from the die 1304 to the heat pipe 1306 by about 26% over the prior art, shown in FIG. 16. The present invention has a uniform power dissipation capacity of about 27 Watts, while that of the prior art was only about 23 Watts. The junction to heat pipe thermal resistance was 0.8° C./W for the present invention and 1.12° C./W for the prior art. The uniform power dissipation was measured with a heat pipe to ambient air thermal resistance ($\theta_{ha}$ of 1.1° C./W, a die temperature of 100° C. and an ambient air temperature of 50° C. Among its many advantages, the present invention offers about 26% lower thermal resistance and increased power handling capacity over the prior art.

FIG. 14 shows a flow chart of one embodiment of a method of assembling an embedded direct heat pipe attachment. The method 1400 comprises: forming a heat-pipe-shaped slot into a spreader plate 1402, placing a heat pipe inside the slot 1404, bonding all but one surface of the heat pipe into the slot to create a subassembly 1406, mounting a die on a substrate 1408, placing a thermal interface material on a top surface of the die 1410, placing the subassembly on the top surface of the thermal interface material 1414, and placing a plate on the top surface of the subassembly 1416. In one embodiment, the method further comprises machining the top surface of the thermal interface material to create a flat surface 1412. In another embodiment, the method further comprises applying force downward from the top of the plate to create a point load substantially at the center of the top surface of the subassembly 1418.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An arrangement for pressing a heat-generating item against a substrate while ensuring that a compressible and easily damaged heat pipe capable of being thermally coupled to the heat-generating item is not damaged, comprising:

an essentially incompressible heat-spreading plate having a first surface engageable with the heat-generating item and a second surface opposed to the first surface;

a groove formed in the first surface of the heat-spreading plate for receiving a first end portion of the heat pipe, the groove having a depth which is substantially the same as or slightly greater than the thickness of the heat pipe, so that a force applied to the second surface of the heat-spreading plate to press the heat-generating item against the substrate has limited compressive effect on the heat pipe; and a spring plate having a first side to receive a force and a second side, parallel to the first side, to apply the force to the second surface of the heat-spreading plate to press the heat-generating item against the substrate, the force directed substantially at the center of the heat-generating item, wherein a protrusion extends outward from the second side for applying and directing the force.

2. The arrangement as in claim 1, further comprising:
a heat sink attached to a second end portion of the heat pipe.

3. The arrangement as in claim 1, further comprising:
means for bonding the first end portion of the heat pipe into the groove so that an exposed surface of the heat pipe is substantially even with the first surface of the heat-spreading plate and capable of being thermally coupled to the heat-generating item.

4. The arrangement as in claim 3, further comprising:
thermal interface material interposeable between the exposed surface of the heat pipe and the heat-generating item, the thermal interface material being capable of thermally coupling the heat pipe to the heat-generating item.

5. The arrangement as in claim 4, wherein
said spring plate presses the thermal interface material into a layer of substantially uniform thickness.

6. An embedded direct heat pipe attachment for providing low thermal resistance for cooling a heat-generating component in a mobile electronic device, comprising:

a heat pipe having at least one exposed surface, the exposed surface being substantially flat and capable of being thermally coupled to the heat-generating component;

thermal interface material thermally coupling the heat pipe to the heat-generating component;

a spreader plate having an upper surface and a lower surface, the upper surface being substantially flat and the lower surface being substantially flat except where it defines a recess capable of receiving all but the exposed surface of the heat pipe;

bonding means between the recess and the heat pipe for bonding the heat pipe to the spreader plate so that the exposed surface is substantially level with the lower surface of the spreader plate; and wherein the heat pipe includes a first end portion, a surface opposite the exposed surface, a first side of end portion and a second side opposite the first side, the bonding means applied to the first end portion only on the first and second sides of the first end portion.

7. The embedded direct heat pipe attachment as in claim 6, wherein
the bonding means is selected from the group consisting of solder and epoxy.

8. The embedded direct heat pipe attachment as in claim 6, wherein
the heat pipe is a remote heat exchanger which includes a second end portion opposite the first end portion, and
the embedded direct heat pipe attachment further comprises:
a heat sink thermally coupled to the second end portion.

9. An electronic assembly, comprising:
a substrate;
a die having a top and mounted on the substrate;
a heat pipe;
a spreader plate defining a recess capable of receiving the heat pipe;
a subassembly including the heat pipe bonded into the recess of the spreader plate so that the subassembly is capable of being thermally coupled directly to the die;

thermal interface material for thermally coupling the die to the subassembly so that the heat pipe is in direct thermal contact with the die; and a plate to apply and direct a point load substantially at the center of the subassembly on a side of the spreader plate opposite to the side having the recess.

10. The electronic assembly as in claim 9, wherein the total height of the electronic assembly is minimized.

11. The electronic assembly as in claim 9, wherein the spreader plate spreads the pressure from the point load so that the heat pipe is not deformed and the thermal interface material is pressed into a very thin layer of substantially uniform thickness.

12. The electronic assembly as in claim 11, wherein the subassembly is thermally coupled to the die so that about 80% of the heat from the die is conducted away from the die by the heat pipe and about 20% of the heat from the die is conducted away from the die by the spreader plate.

13. The electronic assembly as in claim 9, wherein a thermal resistance at the point where the heat pipe and the die engage one another is less than about 0.8 degrees celsius per Watt.

14. The electronic assembly as in claim 13, wherein a uniform power dissipation capacity is about 27 Watts, when a heat pipe to ambient thermal resistance is about 1.1 degrees celsius per Watt, a temperature at the die is about 100 degrees celsius, and an ambient temperature is about 50 degrees celsius.

15. A method of assembling an embedded direct heat pipe attachment, comprising:

bonding a heat pipe into a slot in a spreader plate to create a subassembly;

mounting a die on a substrate;

placing a thermal interface material on at least one of a top surface of the die and a bottom surface of the subassembly;

placing the bottom surface of the subassembly over the top surface of the die; and applying a force to a top surface of the subassembly using a spring plate to press the subassembly against the die.

16. The method as in claim 15, further comprising:

machining a surface of the thermal interface material to create a flat before placing the bottom surface of the subassembly over the top surface of the die.

17. The method as in claim 15, wherein:

applying a force includes applying a point load substantially at the center of the top surface of the subassembly.

* * * * *